United States Patent [19]

Honjo

[11] Patent Number: 5,012,318
[45] Date of Patent: Apr. 30, 1991

[54] HYBRID SEMICONDUCTOR DEVICE IMPLEMENTED BY COMBINATION OF HETEROJUNCTION BIPOLAR TRANSISTOR AND FIELD EFFECT TRANSISTOR

[75] Inventor: Kazuhiko Honjo, Tokyo, Japan
[73] Assignee: NEC Corporation, Tokyo, Japan
[21] Appl. No.: 401,161
[22] Filed: Sep. 1, 1989

[30] Foreign Application Priority Data

Sep. 5, 1988 [JP] Japan ................. 63-222833
Sep. 5, 1988 [JP] Japan ................. 63-222834

[51] Int. Cl.$^5$ .................. H01L 29/205; H01L 27/07
[52] U.S. Cl. ......................... 357/43; 357/4; 357/34; 357/41; 357/16; 357/49; 437/133
[58] Field of Search ............... 357/16, 43, 34, 49, 357/4, 41; 437/133

[56] References Cited

U.S. PATENT DOCUMENTS

| | | | |
|---|---|---|---|
| 3,626,257 | 12/1971 | Lee Esaki et al. | 357/16 |
| 4,439,782 | 3/1984 | Holonyak, Jr. | 357/16 |
| 4,450,463 | 5/1984 | Chin | 357/16 |
| 4,635,343 | 1/1987 | Kuroda | 357/22 |
| 4,688,068 | 8/1987 | Chaffin et al. | 357/16 |
| 4,695,857 | 9/1987 | Baba et al. | 357/16 |
| 4,792,832 | 12/1988 | Baba et al. | 357/16 |
| 4,821,090 | 4/1989 | Yokoyama | 357/16 |
| 4,849,934 | 7/1989 | Yokoyama et al. | 365/159 |
| 4,873,558 | 10/1989 | Antreasyan et al. | 357/16 |

FOREIGN PATENT DOCUMENTS

| | | | |
|---|---|---|---|
| 61-296765 | 12/1986 | Japan | 357/16 |
| 62-130561 | 6/1987 | Japan | 357/16 |
| 62-152165 | 7/1987 | Japan | 357/16 |
| 62-205658 | 9/1987 | Japan | 357/34 |
| 62-216361 | 9/1987 | Japan | 357/16 |

OTHER PUBLICATIONS

Lakhani et al., "Combining Resonant Tunneling Diodes for Signal Processing and Multilevel Logic", Applied Physics Lett. 52(20), May 16, 1988, pp. 1684–85.
Yoo et al., "Influence of Spacer Layer Thickness . . . Tunneling Diodes", Applied Physics Lett. 56(1), Jan. 1, 1990, pp. 84–86.
Capasso et al., "Multiple Negative Transconductance . . . Resonant Tunneling", Applied Physics Lett. 53(12), Sep. 19, 1988, pp. 1056–1058.
Sen et al., "New Resonant-Tunneling Devices with . . . Peak-to-Valley Ratio", IEEE Electron Dev. Letters, vol. 9, No. 8, Aug. 1988, pp. 402–404.
Potter et al., "Three-Dimensional Integration of . . . Three-State Logic", Applied Physics Lett. 52(25), Jun. 20, 1988, pp. 2163–2164.
Tsuchiya et al., "Dependence of Resonant Tunneling Current . . . Diode Structures", Applied Physics Lett. 49(2), Jul. 14, 1986, pp. 88–90.
Tsuchiya et al., "Dependence of Resonant Tunneling Current on Al Mole . . . Structures", Applied Physics Lett. 50(21), May 25, 1987, pp. 1503–1505.

(List continued on next page.)

*Primary Examiner*—Jerome Jackson, Jr.
*Attorney, Agent, or Firm*—Burns, Doane, Swecker & Mathis

[57] ABSTRACT

A hybrid semiconductor device according to the present invention is implemented by an unipolar compound semiconductor transistor and a heterojunction bipolar transistor respectively formed in first and second multiple-level structures formed on a semi-insulating substrate, and the uppermost level of the first multiple-level structure is formed in a common layer which further provides the lowest level of the second multiple-level structure, wherein an isolation is given between the unipolar compound semiconductor transistor and the heterojunction bipolar transistor and penetrates from the common layer into the semi-insulating substrate, so that the first and second multiple-level structures are formed through a uniform epitaxial growth advantageous in the controllability.

24 Claims, 14 Drawing Sheets

OTHER PUBLICATIONS

"(Invited) MBE-Grown GaAs/N-AlGaAs Herterostructures and Their Application to High Electron Mobility Transistors", Hiyamizu et al., Japanese Journal of Applied Physics, vol 21, (1982), Suppl. 21-1, pp. 161–168.

"Low Noise Normally on and Normally Off Two-Dimensional Electron Gas Field-Effect Transistor", Laviron et al., Applied Physics Letters, 40(6), Mar. 15, 1982, pp. 530–532.

"A New Functional, Resonant-Tunneling Hot Electron Transistor (RHET)", Yokoyama et al., Japanese Journal of Applied Physics, vol. 24, No. 11, Nov. 1985, pp. L853 and L854.

"A Resonant-Tunneling Bipolar Transistor (RBT)-A New Functional Device with High Current Gain", Futatsugi et al., Japanese Journal of Applied Physics, vol. 26, No. 2, Feb. 1987, pp. L131-L133.

"A New $Al_{0.3}Ga_{0.7}As$/GaAs Modulation-Doped FET", Kopp et al., IEEE Electron Device Letters, vol. EDL-3, No. 5, May 1982, pp. 109–111.

HYBRID SEMICONDUCTOR DEVICE IMPLEMENTED BY COMBINATION OF HETEROJUNCTION BIPOLAR TRANSISTOR AND FIELD EFFECT TRANSISTOR

FIELD OF THE INVENTION

This invention relates to a hybrid semiconductor device implemented by a combination of a heterojunction, bipolar transistor and a field effect transistor such as, for example, an Schottky gate type field effect transistor or a high electron mobility transistor.

DESCRIPTION OF THE RELATED ART

A compound semiconductor material such as gallium arsenide has various attractive properties which, by way of example, are a large electron mobility, a high electron saturation velocity, a semi-insulativity and an alpha-particle proof ability. Then, research and development efforts are being made for the integration technology for fabricating integrated circuits by using the compound semiconductors, and several compound semiconductor devices are commercially available. Such a compound semiconductor device is implemented by a bipolar transistor such as a heterojunction bipolar transistor (abbreviated as HBT) or, alternatively, by a unipolar transistor or a field effect transistor (abbreviated as FET).

In general, the bipolar transistor is superior in the current driving capability, the switching speed and the low 1/f noise characteristics to the unipolar transistor, however, the power consumption is rather large. On the other hand, the unipolar transistor has low frequency noise characteristics, and is small in the power consumption. However, the unipolar transistor is inferior in the 1/f noise characteristics as well as in the current driving capability to the bipolar transistor. The bipolar transistors and the unipolar transistors are integrated on a single silicon chip in such a manner as to supplement the disadvantages inherent in one of the two types of the transistors with the other type of the transistors, and such a hybrid semiconductor device is referred to as "Bi-CMOS" device.

The hybrid integration is also desirable for a compound semiconductor device, and the development efforts result in some structures. One of the hybrid integration structure is shown in FIG. 1 of the drawings. Referring to FIG. 1, a hybrid semiconductor device is implemented by a combination of a heterojunction bipolar transistor 1 and a high electron mobility transistor 2 fabricated on a semi-insulating gallium arsenide substrate 3. The heterojunction bipolar transistor 1 comprises an n+-type gallium arsenide layer 4, an n-type gallium arsenide layer 5, a p+-type gallium arsenide layer 6, an n-type aluminum gallium arsenide layer 7 and an n+ gallium arsenide layer 8 which are successively grown on the semi-insulating gallium arsenide substrate 3 by using selective epitaxial techniques. An emitter electrode 9, a base electrode 10 and a collector electrode 11 are respectively formed of an aurum-germanium-nickel alloy, an aurum-manganese-nickel alloy and aurum-germanium-nickel alloy, and are provided on the n+ gallium arsenide layer 8, the p+-type gallium arsenide layer 6 and the n+-type gallium arsenide layer 4, respectively.

On the other hand, the high electron mobility transistor achieves a high switching speed by using a two-dimensional electron gas, and is abbreviated as "HEMT" or "2DEGFET". The high electron mobility transistor 2 comprises a non-doped gallium arsenide layer 12 and an n-type aluminum gallium arsenide layer 13 which are selectively and epitaxially grown on the semi-insulating gallium arsenide substrate 3 in a spacing relationship with the heterojunction bipolar transistor 1 by using a metal organic chemical vapor deposition technique. An aluminum gate electrode 14 and source and drain electrodes 15 and 16 of the aurum-germanium-nickel alloy are formed on the n-type aluminum gallium arsenide layer 13, and the gate electrode 15 is spaced apart from the source and drain electrodes 15 and 16.

FIGS. 2 and 3 show energyband diagrams produced in the heterojunction bipolar transistor 1 and the high electron mobility transistor 2 taken along lines A and B under appropriate biasing states for active modes, respectively. In FIGS. 2 and 3, Ec stands for bottom edges of the conduction bands, and Ev and Ef respectively represent uppermost edges of the valence bands and the Fermi levels. As will be seen from FIG. 2, a partial built-in potential takes place between the emitter and base junction, and, for this reason, minority carriers are blocked by the partial built-in potential in the active mode. This result in improvement on the emitter injection efficiency which in turn results in various attractive features. Turning to FIG. 3 of the drawings, an electron confinement well takes place in the nondoped gallium arsenide layer 12 under the appropriate biasing state, and the two-dimensional electron gas is confined therein for enhancing the switching speed. These energyband diagrams are familiar to the person skilled in the art, so that no further description is incorporated for the operations of those transistors.

Turning to FIG. 4 of the drawings, another hybrid integration is illustrated and comprises a heterojunction bipolar transistor 21 and an Schottky gate type field effect transistor 22 fabricated on a semi-insulating gallium arsenide substrate 23. The heterojunction bipolar transistor 21 comprises an n+-type gallium arsenide layer 24, an n-type gallium arsenide layer 25, a p+-type gallium arsenide layer 26, an n-type aluminum gallium arsenide layer 27 and an n+ gallium arsenide layer 28 which are successively and selectively grown on the semi-insulating gallium arsenide substrate 23 by using metal organic chemical vapor deposition technique. An emitter electrode 29, a base electrode 30 and a collector electrode 31 are respectively formed of an aurum-germanium-nickel alloy, an aurum-manganese-nickel alloy and aurum-germanium-nickel alloy, and are provided on the n+ gallium arsenide layer 28, the p+-type gallium arsenide layer 26 and the n+-type gallium arsenide layer 24, respectively.

On the semi-insulating gallium arsenide substrate 23 is further grown an n-type gallium arsenide layer 32 which is spaced apart from the heterojunction bipolar transistor 21, and a metal organic chemical vapor deposition technique is used for selective epitaxy. An aluminum gate electrode 33 and source and drain electrodes 34 and 35 of the aurum-germanium-nickel alloy are formed on the n-type gallium arsenide layer 32, and the gate electrode 33 is spaced apart from the source and drain electrodes 34 and 35. The behavior of the Schottky gate type field effect transistor 22 is well known in the art, so that no further description is incorporated hereinunder.

A problem is encountered in the prior art semiconductor devices in selective epitaxial growth. This is because of the fact that the selective epitaxial growth is less controllable to form a miniature and complex structure inherent in the hybrid integration, and, accordingly, irregularities tend to take place in the transistor characteristics such as, for example, a threshold voltage level. The selective epitaxial growth further inherently has a problem in a prolonged process sequence, and the production cost is much liable to be increased.

SUMMARY OF THE INVENTION

It is therefore an important object of the present invention to provide a hybrid semiconductor device implemented by a combination of a heterojunction bipolar transistor and a field effect transistor which is less liable to have the irregularities in the device characteristics.

It is also an important object of the present invention to provide a process for fabrication of the hybrid semiconductor device which is desirable to form a miniature and complex structure.

To accomplish these objects, the present invention proposes to form an isolation penetrating a common layer shared between a unipolar transistor and a heterojunction bipolar transistor.

In accordance with one aspect of the present invention, there is provided a hybrid semiconductor device fabricated on a semi-insulating substrate of a first compound semiconductor material, comprising: (a) a first multiple-level structure formed of a first group of compound semiconductor materials and providing a unipolar transistor together with a gate electrode and source and drain electrodes, the first multiple-level structure having the uppermost level provided by a first portion of a common layer; (b) a second multiple-level structure formed of a second group of compound semiconductor materials and providing a bipolar transistor together with emitter, base and collector electrodes, the second multiple-level structure having the lowest level provided by a second portion of the common layer; and (c) isolating means penetrating the common layer and the first multiple-level structure except for the uppermost level for providing an electrical isolation between the unipolar transistor and the bipolar transistor, in which the first portion is substantially coextensive with the second portion, and in which the first multiple-level structure except for the first portion is overlain by the second multiple-level structure.

In accordance with another aspect of the present invention, there is provided a process of fabricating a hybrid semiconductor device, comprising the steps of: (a) preparing a semi-insulating substrate; (b) uniformly growing compound semiconductor films on the semi-insulating substrate by using an epitaxial growing technique, the compound semiconductor films providing a lower layer structure and an upper layer structure, a common layer being shared between the lower layer structure and the upper layer structure; (c) shaping the upper layer structure to partially fabricate a bipolar transistor; (d) forming emitter, base and collector electrodes so that the bipolar transistor is completed; (e) partially removing the common layer to form a recess; (f) forming a gate electrode in the recess; (g) forming source and drain electrodes on the common layer so that a unipolar transistor is completed; and (h) providing an isolation between the bipolar transistor and the unipolar transistor, the isolation penetrating from the common layer into the semi-insulating substrate.

BRIEF DESCRIPTION OF THE DRAWINGS

The features and advantages of a hybrid semiconductor device implemented by a combination of a heterojunction bipolar transistor and a field effect transistor according to the present invention will be more clearly understood from the following description taken in conjunction with the accompanying drawings in which.

DESCRIPTION OF THE PREFERRED EMBODIMENTS

First Embodiment

Figure 5:
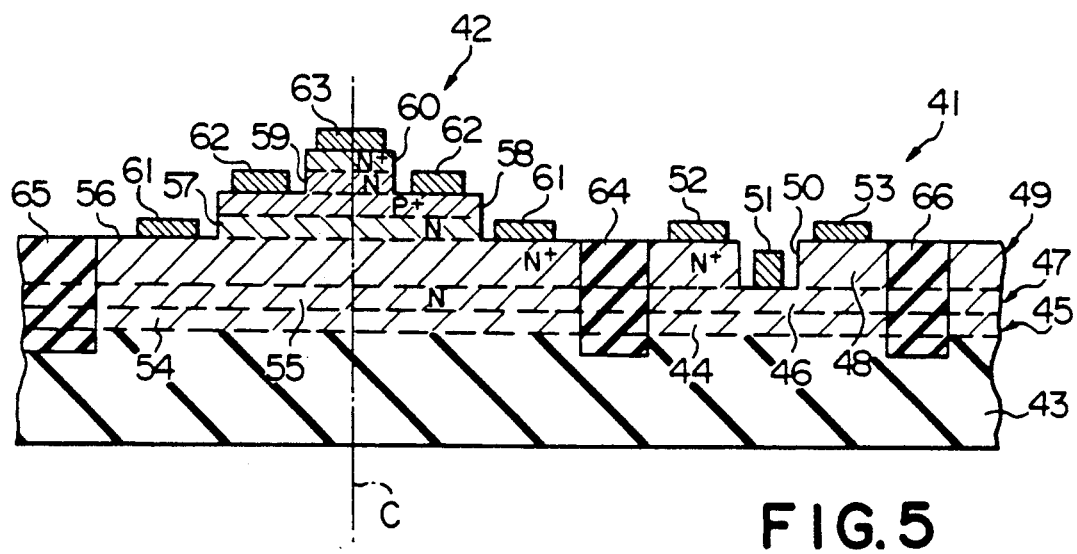
FIG. 5 is a cross sectional view showing the structure of a hybrid semiconductor device embodying the present invention.

Referring first to FIG. 5 of the drawings, a hybrid integrated device is implemented by a high electron mobility transistor 41 and a heterojunction bipolar transistor 42 which are fabricated on a semi-insulating gallium arsenide substrate 43 in a laterally spacing relationship with one another. The high electron mobility transistor 41 comprises a first portion 44 of a first layer 45 of an intentionally undoped gallium arsenide formed on the semi-insulating gallium arsenide substrate 43, a first portion 46 of a second layer 47 of an n-type aluminum gallium arsenide formed on the first portion 44 of the first layer 45, and a contact layer 48 of an n+-type gallium arsenide. The first portion 48 is partially removed to form a recess 50, and an aluminum gate electrode 51 is formed in the recess 50 and in contact with an exposed area of the first portion 46. Source and drain electrodes 52 and 53 of the aurum-germanium-nickel alloy are provided on the contact layer 48 and spaced apart from one another.

On the other hand, the heterojunction bipolar transistor 42 comprises a second portion 54 of the first layer 45, a second portion 55 of the second layer 47, however, these first and second layers 45 and 47 do not directly participate the behavior of the heterojunction bipolar transistor 42. The heterojunction bipolar transistor 42 further comprises a sub-collector layer 56 of an n+-type gallium arsenide formed on the second portion 55, a collector layer 57 of an n-type gallium arsenide formed on the sub-collector layer 56, a base layer 58 of a p+-type gallium arsenide formed on the collector layer 57, an emitter layer 59 of an n-type aluminum gallium arsenide formed on the base layer 59 of and an emitter cap layer 60 of an n+-type gallium arsenide formed on the emitter layer 59. The collector layer 47 and the base layer 58 are partially removed to expose a peripheral area of the sub-collector layer 56, and a collector electrode 61 of an aurum-germanium-nickel alloy is provided on the exposed area of the sub-collector layer 56. Similarly, the emitter layer 59 and the emitter cap layer 60 are partially removed to expose a peripheral area of the base layer 58, and a base electrode 62 of aurum-manganese-nickel alloy is provided on the exposed peripheral area of the base layer 58. An emitter electrode 63 is made of the aurum-germanium-nickel alloy, and is formed on the emitter cap layer 63.

The contact layer 48 is contiguous to the sub-collector layer 56, however, an isolating region 64 is provided between the contact layer 48 and the sub-collector layer 56 for electrically isolating the high electron mobility transistor 41 from the heterojunction bipolar transistor 42. Isolating regions 65 and 66 are further provided on the other side of the heterojunction bipolar transistor 42 and on the other side of the high electron mobility transistor 41 so that these transistors 42 and 41 are isolated from other component elements (not shown). The isolating regions 64 to 66 project from the contact layer 48 and the sub-collector layer 56 and reach the semi-insulating gallium arsenide substrate 43. The high electron mobility transistor 41 and the heterojunction bipolar transistor 42 are respectively coupled to the other component elements through interconnections, however, these interconnections are omitted for the sake of simplicity. In this instance, the first and second layers 45 and 47, the contact layer 48 as a whole constitute a first multiple-level structure, and the sub-collector layer 56, the collector layer 57, the base layer 58, the emitter layer 59 and the emitter cap layer 60 form in combination a second multiple-level structure.

Figure 1:
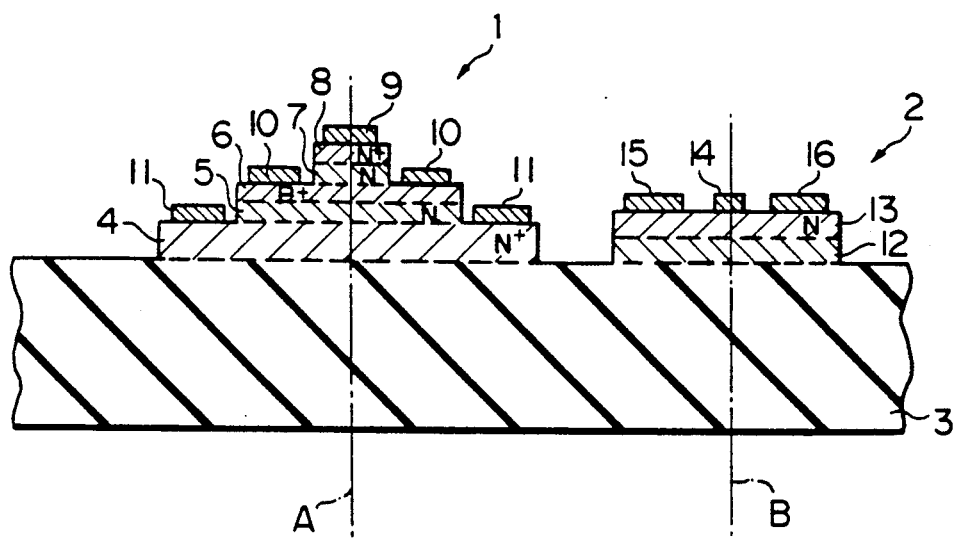
FIG. 1 is a cross sectional view showing the structure of a prior art hybrid integration provided with a heterojunction bipolar transistor and a high electron mobility transistor.
Figure 2:
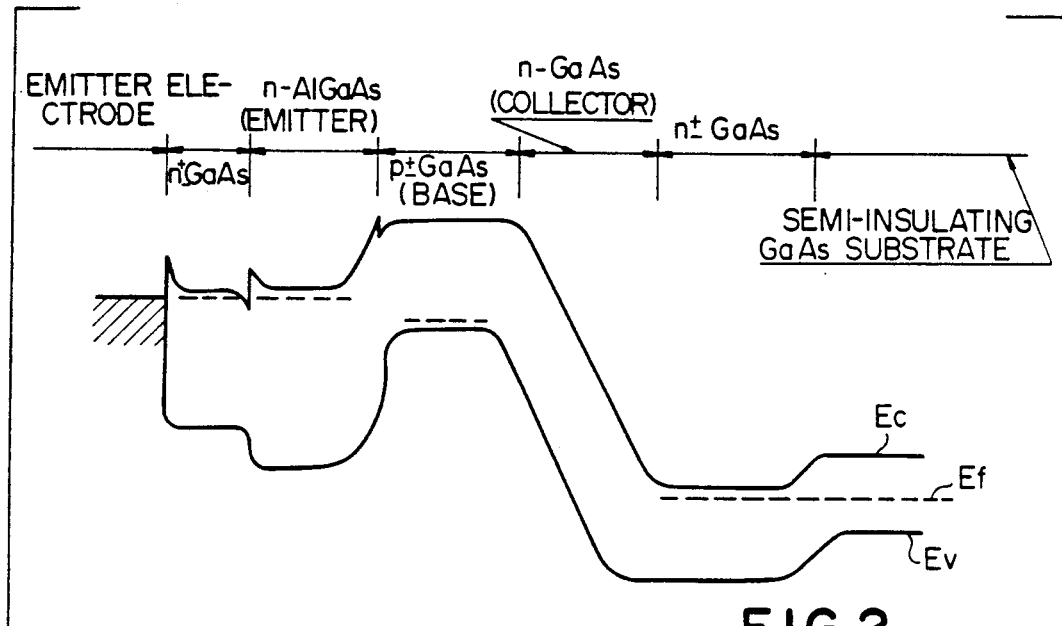
FIG. 2 is a diagram showing an energyband produced in the heterojunction bipolar transistor taken along the line A of FIG. 1 under an appropriate biasing state for an active mode.
Figure 3:
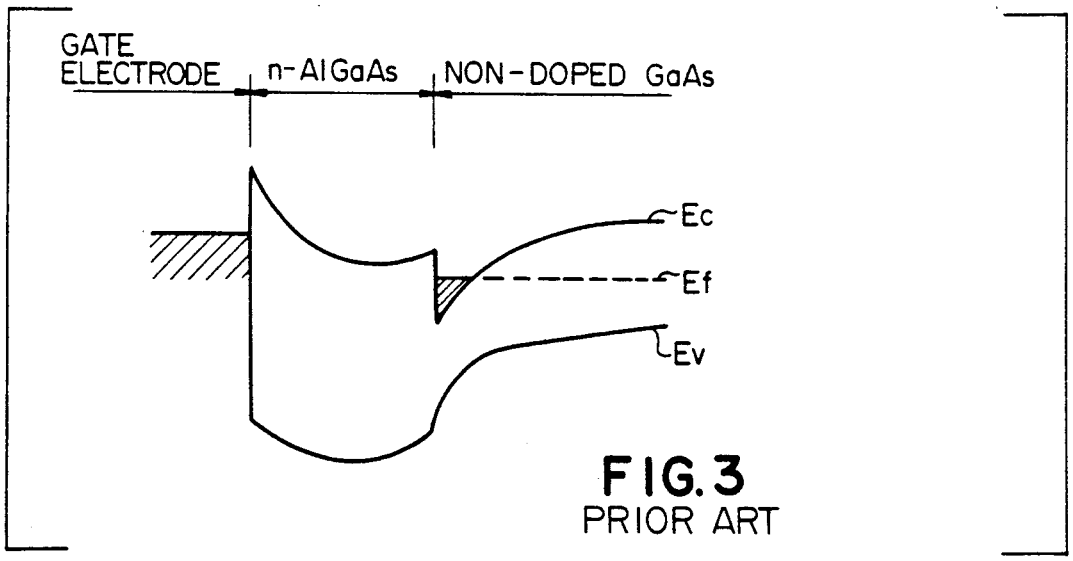
FIG. 3 is a diagram showing an energyband produced in the high electron mobility transistor taken along the line B of FIG. 1 under an appropriate biasing state for an active mode.
Figure 4:
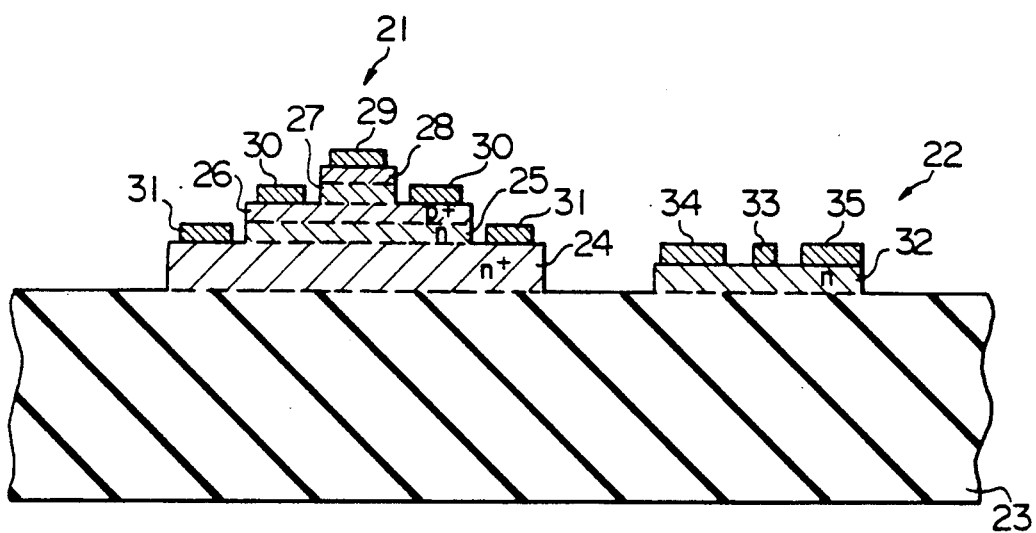
FIG. 4 is a cross sectional view showing the structure of another prior art hybrid integration provided with a heterojunction bipolar transistor and an Schottky gate type field effect transistor.

The high electron mobility transistor 41 is similar in the behavior to that shown in FIG. 1, and, for this reason, no further description is made for the high electron mobility transistor 41.

Figure 6:
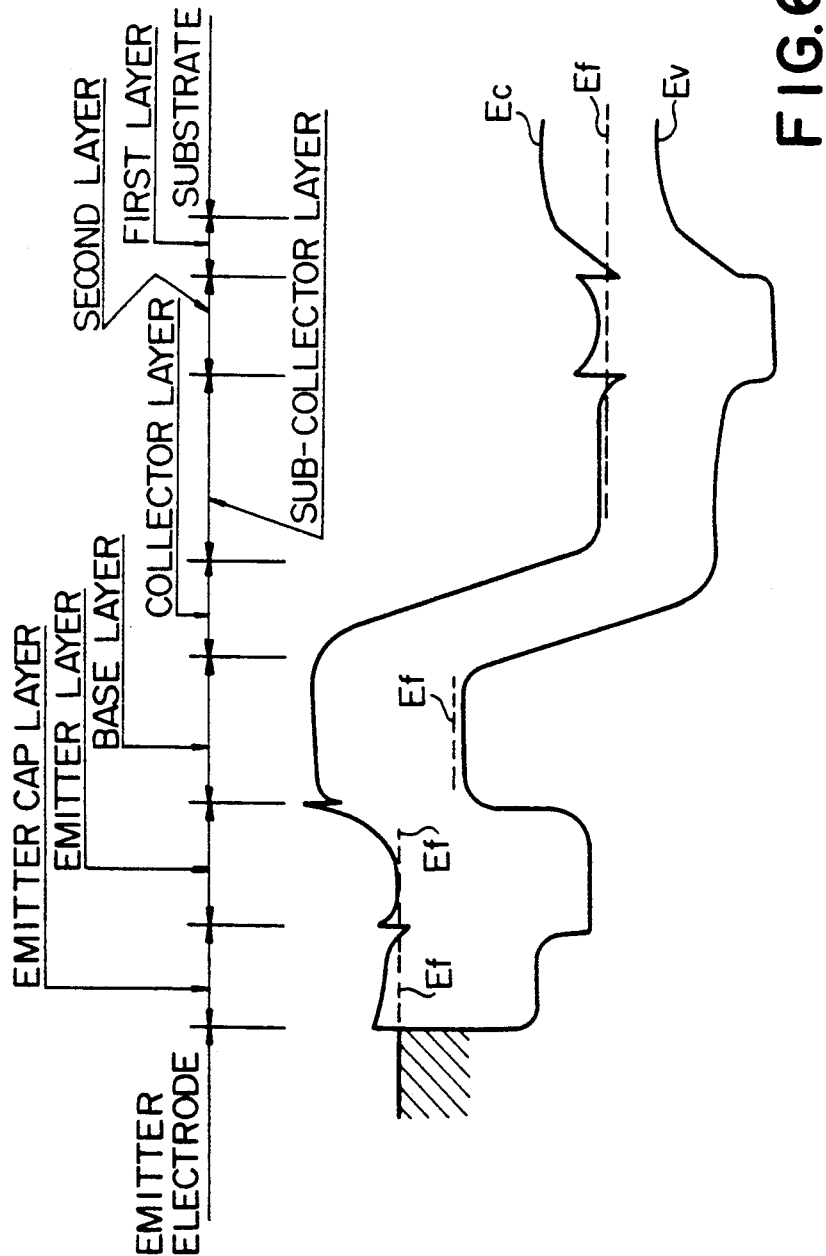
FIG. 6 is a diagram showing an energyband produced in the heterojunction bipolar transistor taken along the line C of FIG. 5 under an appropriate biasing state for an active mode of operation.

FIG. 6 shows an energyband produced in the heterojunction bipolar transistor 42 taken along line C under an appropriate biasing state for an active mode of operation. In FIG. 6, Ec stands for the bottom edges of the conduction bands, and Ev and Ef indicate the uppermost edges of the valence bands and the Fermi levels, respectively. A partial built-in potential takes place between the emitter and base junction, and, for this reason, minority carriers are blocked by the partial built-in potential in the active mode. This result in improvement on the emitter injection efficiency which in turn results in various attractive features. As will be better seen from FIG. 6, abrupt discontinuities take place in the bottom edges of the conduction bands between the sub-collector layer 56 and the second layer 55 and between the first and second layers, respectively, and a collector current flows in the sub-collector layer 56 in the direction normal to the paper where FIG. 5 is illustrated. This means that the abrupt discontinuities never block the collector current. The abrupt potential discontinuities are rather preferable, because of improvement on the isolation.

Figure 7A:
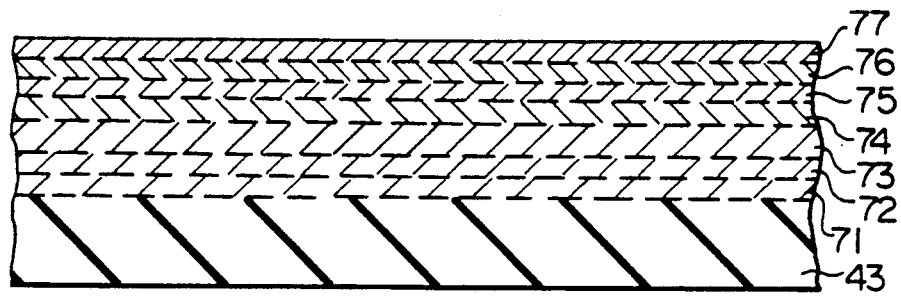
FIGS. 7A to 7F are cross sectional views showing the process sequence through which the hybrid semiconductor device shown in FIG. 5 is fabricated.
Figure 7B:
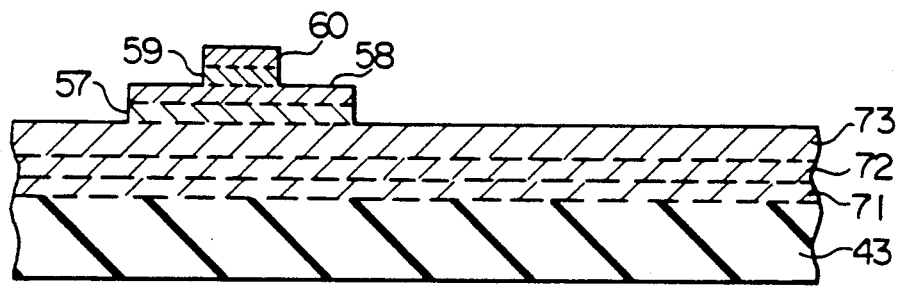

Turning to FIG. 7A to 7F, description is made for a process for fabricating the structure shown in FIG. 5. The process sequence starts with preparation of the semi-insulating substrate 43 of gallium arsenide. On the semi-insulating substrate 43 are successively grown an intentionally undoped gallium arsenide film 71, an n-type aluminum gallium arsenide film 72, a heavily doped n-type gallium arsenide film 73, an n-type gallium arsenide film 74, a heavily doped p-type gallium arsenide film 75, an n-type aluminum gallium arsenide film 76 and a heavily doped n-type gallium arsenide film 77 by using a molecular beam epitaxy. The films 71 and 72 serve as the first and second films 45 and 47, respectively. The heavily doped n-type gallium arsenide film 73 is doped with n-type impurity atoms of about $5 \times 10^{18}$ cm$^{-3}$ and has a thickness of about 4000 angstroms, and the n-type gallium arsenide film 74 is about 3000 angstroms in thick and has an n-type impurity concentration of about $5 \times 10^{16}$ cm$^{-3}$. The heavily doped p-type gallium arsenide film 75 is doped with p-type impurity atoms of about $4 \times 10^{19}$ cm$^{-3}$ and has a thickness of about 500 angstroms, and the n-type aluminum gallium arsenide film 76 forms a heterojunction together with the heavily-doped p-type gallium arsenide film 75. The aluminum gallium arsenide film 76 has an n-type impurity atom concentration of about $3 \times 10^{17}$ cm$^{-3}$ and a thickness of about 1500 angstroms, and the heavily doped n-type gallium arsenide film 77 is doped with n-type impurity atoms of about $5 \times 10^{18}$ cm$^{-3}$ and about 1000 angstroms in thick. The resultant structure of this stage is illustrated in FIG. 7A.

An appropriate mask layer is formed on the structure, and the heavily doped gallium arsenide film 77 and the n-type aluminum gallium arsenide film 76 are etched away to form the emitter cap layer 60 and the emitter layer 59. The mask formation and the etching process are repeated to form the base and collector layers 58 and 57, and, consequently, the structure is partially shaped into an emitter-mesa configuration and partially shaped into a base-mesa configuration as will be seen from FIG. 7B.

Figure 7C:
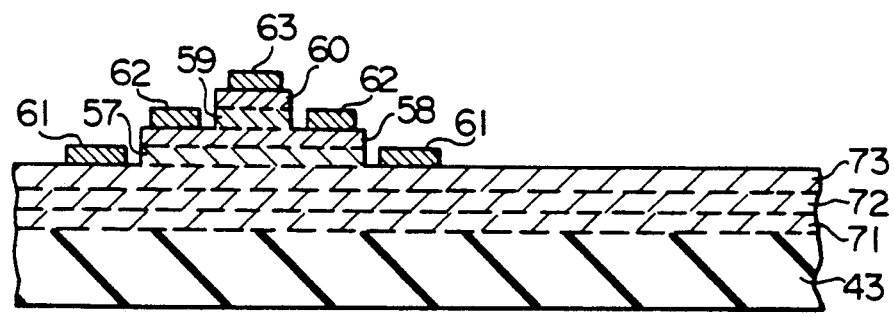

Subsequently, the emitter electrode 63, the base electrode 62 and the collector electrode 61 are formed on the emitter cap layer 60, the base layer 58 and the heavily doped n-type gallium arsenide film 73, respectively, by sequentially applying a deposition technique and photoresist and lift-off techniques, however, detailed description is omitted, because these techniques are well known in the art. The resultant structure of this stage is shown in FIG. 7C.

Figure 7D:
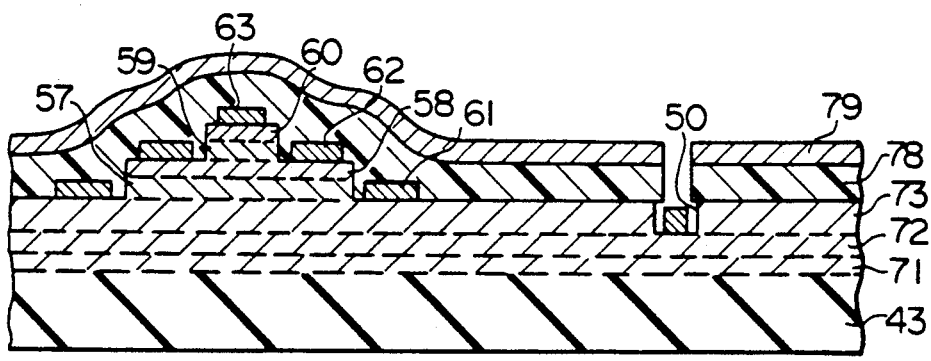

A photoresist solution is spread over the entire surface, and the photoresist film is patterned to form a photoresist mask 78. Using the photoresist mask 78, the heavily doped n-type gallium arsenide film 73 is partially removed to form the recess 50, and the recess 50 exposes the top surface of the n-type aluminum gallium arsenide film 72 or the second layer 47. Aluminum 79 or, alternatively, an aluminum alloy is deposited over the entire surface of the structure, and the aluminum reaches the exposed top surface of the n-type aluminum gallium arsenide film 72 as shown in FIG. 7D. When the photoresist mask 78 is stripped off, the aluminum is left on the top surface of the n-type aluminum gallium arsenide film 72, and the aluminum thus left on the top surface serves as the gate electrode 51.

Figure 7E:
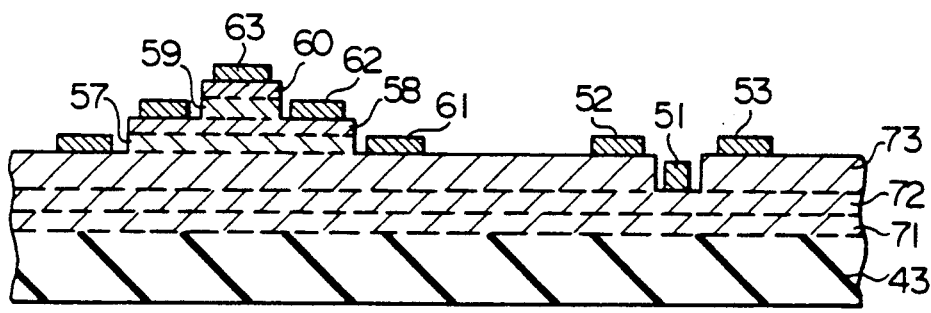

A deposition technique and lithographic techniques are applied to the resultant structure again, and, consequently, the source and drain electrodes 52 and 53 are formed on those areas over the respective side areas with respect to the gate electrode 51. The resultant structure of this stage is shown in FIG. 7E.

Figure 7F:
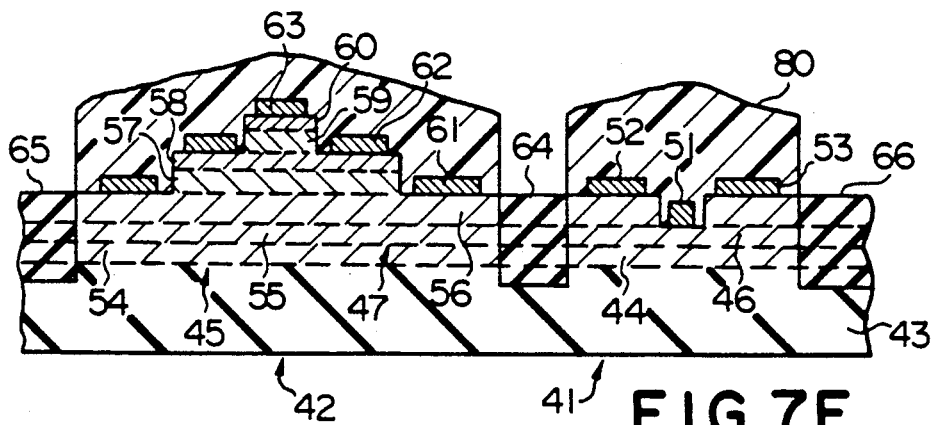

A photoresist solution is spun onto the entire surface of the structure again, and the photoresist film is patterned to form a photoresist mask 80 which partially exposes the heavily doped gallium arsenide film 73. Boron atoms are ion implanted into the exposed heavily doped n-type gallium arsenide film 73 at dose of about $3 \times 10^{15}$ cm$^{-2}$ with the acceleration energy of about 400 KeV. With the implanted boron atoms, the isolation regions 64 to 66 are formed in the structure as shown in FIG. 7F, and the isolation region 64 electrically separates the heterojunction bipolar transistor 42 from the high electron mobility transistor 41.

After the formation of the isolation regions 64 to 66, the photoresist mask 80 is stripped off, and the hybrid semiconductor device shown in FIG. 5 is obtained.

Second Embodiment

Figure 8:
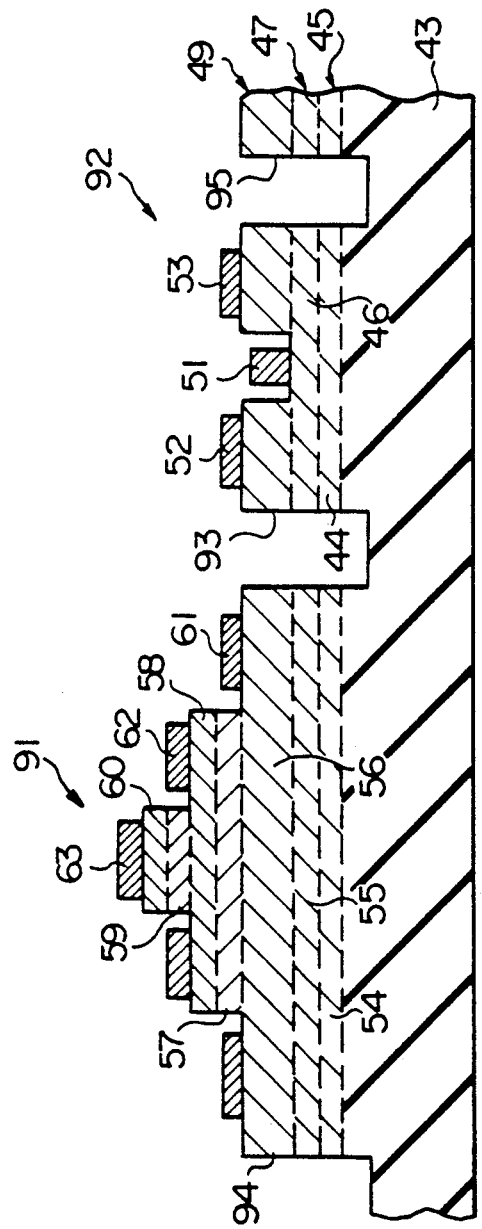
FIG. 8 is a cross sectional view showing another hybrid semiconductor device embodying the present invention.

Turning to FIG. 8 of the drawings, another hybrid semiconductor device is implemented by a heterojunction bipolar transistor 91 and a high electron mobility transistor 92 in accordance with the present invention. However, the heterojunction bipolar transistor 91 and the high electron mobility transistor 92 are similar in structure to the heterojunction bipolar transistor 42 and the high electron mobility transistor 41, and, for this reason, the component layers are designated by like reference numerals used in FIG. 5 for the sake of simplicity.

The hybrid semiconductor device shown in FIG. 8 is characterized by hollow spaces 93 to 95 serving as isolation means. The hollow spaces 93 to 95 penetrate from the common layer 49 and reach the semi-insulating substrate 43. The hollow spaces 93 to 95 thus shaped provide electric isolation among the component elements.

Figure 9A:
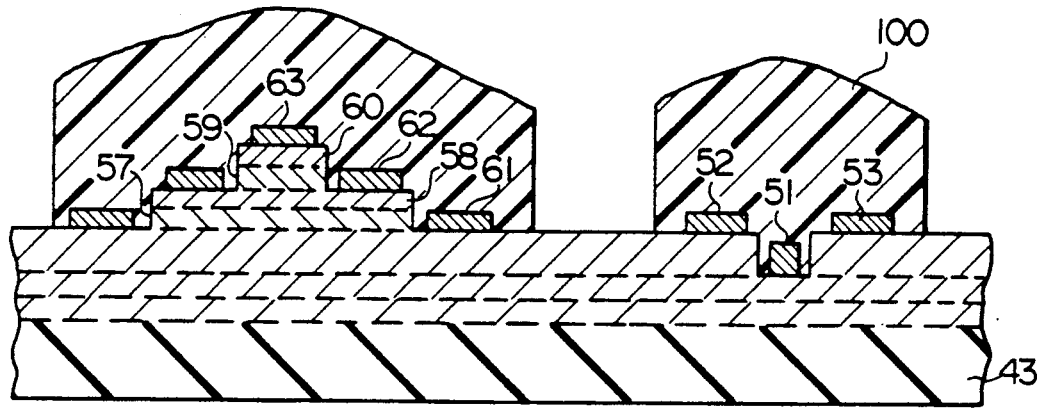
FIGS. 9A and 9B are cross sectional views showing an essential part of a process sequence used for fabricating the hybrid semiconductor device shown in FIG. 8.
Figure 9B:
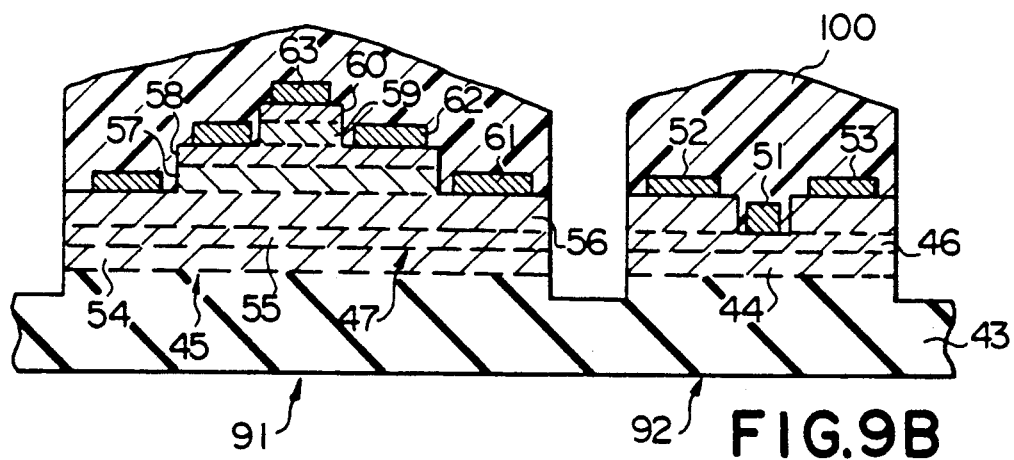

A process sequence for the hybrid semiconductor device is partially identical with the process sequence for the fabrication of the hybrid semiconductor device shown in FIG. 5. Namely, the process sequence passes through the stages illustrated in FIGS. 7A to 7E, and, then, a photoresist solution is spun onto the entire surface of the structure. The photoresist film is patterned to form a photoresist mask 100 through an exposure stage followed by a development stage, and the photoresist mask 100 exposes peripheral areas of the heterojunction bipolar transistor 91 and the high electron mobility transistor 92 as shown in FIG. 9A.

Upon completion of the photoresist mask 100, the common layer 49 and the first and second layers 45 and 47 are partially removed by using an anisotropical etching technique such as, for example, a reactive ion etching technique. This results in the hollow spaced 93 to 95, and the hollow space 93 electrically separates the heterojunction bipolar transistor 91 from the high electron mobility transistor 92.

Third Embodiment

Figure 10:
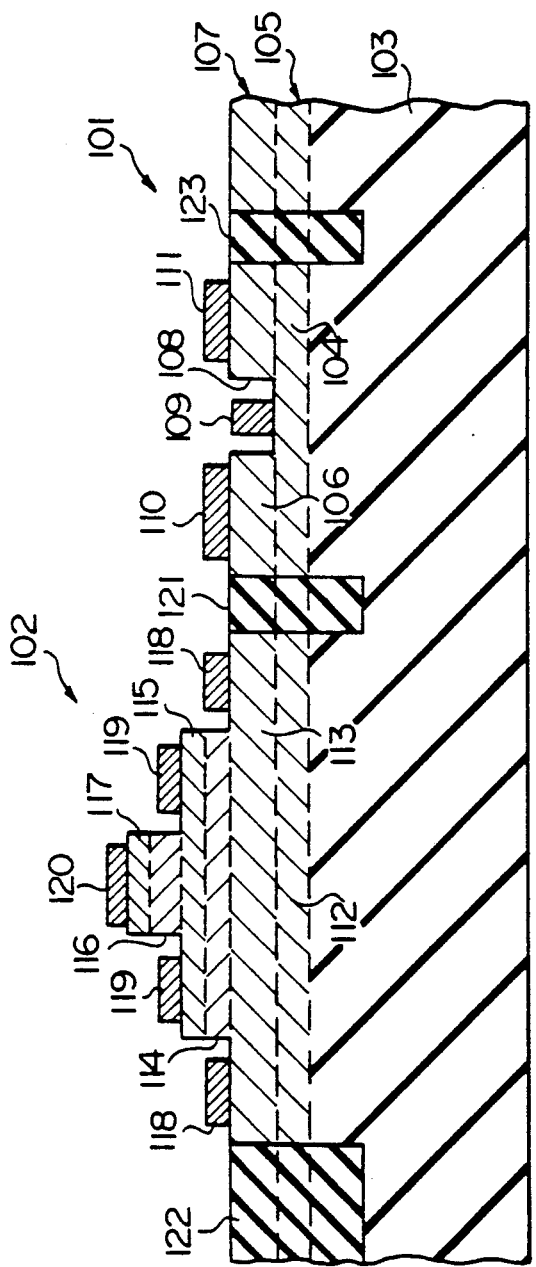
FIG. 10 is a cross sectional view showing the structure of still another hybrid semiconductor device embodying the present invention.

Referring to FIG. 10 of the drawings, a hybrid integrated device is implemented by a Schottky gate type field effect transistor 101 and a heterojunction bipolar transistor 102 which are fabricated on a semi-insulating gallium arsenide substrate 103 in a, laterally spacing relationship with one another. The Schottky gate type field effect transistor 101 comprises a first portion 104 of a first layer 105 of an n-type gallium arsenide formed on the semi-insulating gallium arsenide substrate 103, and a contact layer 106 of a heavily doped n-type gallium arsenide. The first portion 106 is partially removed to form a recess 108, and an aluminum gate electrode 109 is formed in the recess 108 and in contact with an exposed area of the first portion 104. Source and drain electrodes 110 and 111 of the aurum-germanium-nickel alloy are provided on the contact layer 106 and spaced apart from one another. Since the contact layer 106 is heavily doped with n-type impurity atoms, the source and drain electrodes 110 and 111 are brought into contact with the contact layer 106 in the ohmic fashion On the other hand, the heterojunction bipolar transistor 102 comprises a second portion 112 of the first layer 105, however, the first layer 105 does not directly participate the behavior of the heterojunction bipolar transistor 102. The heterojunction bipolar transistor 102 further comprises a sub-collector layer 113 of a heavily doped n-type gallium arsenide formed on the second portion 112, a collector layer 114 of an n-type gallium arsenide formed on the sub-collector layer 113, a base layer 115 of a p$^+$-type gallium arsenide formed on the collector layer 114, an emitter layer 116 of an n-type aluminum gallium arsenide formed on the base layer 115, and an emitter cap layer 117 of a heavily doped n-type gallium arsenide formed on the emitter layer 116. The collector layer 114 and the base layer 115 are partially removed to expose a peripheral area of the sub-collector layer 113, and a collector electrode 118 of an aurum-germanium-nickel alloy is provided on the exposed area of the sub-collector layer 113. Similarly, the emitter layer 116 and the emitter cap layer 117 are partially removed to expose a peripheral area of the base layer 115, and a base electrode 119 of aurum-manganese-nickel alloy is provided on the exposed peripheral area of the base layer 115. An emitter electrode 120 is formed on the emitter cap layer 120.

The contact layer 106 is contiguous to the sub-collector layer 113, however, an isolating region 121 is provided between the contact layer 106 and the sub-collector layer 113 for electrically isolating the Schottky gate type field effect transistor 101 from the heterojunction bipolar transistor 102. Isolating regions 122 and 123 are further provided on the other side of the heterojunction bipolar transistor 102 and on the other side of the Schottky gate type field effect transistor 101 so that these transistors 102 and 101 are isolated from other component elements (not shown). The isolation regions 121 to 123 are made of insulating materials, and are formed by implanting boron atoms into the layers 107 and 105. The isolating regions 121 to 123 penetrate from the contact layer 106 and the sub-collector layer 113, and reach the semi-insulating gallium arsenide substrate 103. The Schottky gate type field effect transistor 101 and the heterojunction bipolar transistor 102 are respectively coupled to the other component elements through interconnections, however, these interconnections are omitted for the sake of simplicity. In this instance, the first layer 105 and the contact layer 106 as a whole constitute a first multiple-level structure, and the sub-collector layer 113, the collector layer 114, the base layer 115, the emitter layer 116 and the emitter cap layer 117 form in combination a second multiple-level structure.

There is a relationship between the thickness D1 of the first layer 105 and the concentration n of the n-type impurity atoms doped into the first layer 105, and the relationship is given by the following equation $$D1 = \sqrt{\frac{2\epsilon s}{q \times n}\left(V_{bi} - V_T - \frac{kT}{q}\right)}$$

where $\epsilon s$ is the permittivity of the gallium arsenide, q is the magnitude of electric charge, $V_{bi}$ is the built-in potential of about 0.75 volt at the Shottoky junction between the aluminum and the gallium arsenide, k is the Boltzmann constant, T indicates a temperature, and $V_T$ is the threshold voltage level of the Schottky gate type field effect transistor. In this instance, the first layer is about 1570 angstroms in thick, and the impurity atom concentration n is about $1 \times 10^{17}$ cm$^{-3}$. Therefore, the threshold voltage level is calculated from the above equation as about $-1$ volt.

Figure 11A:
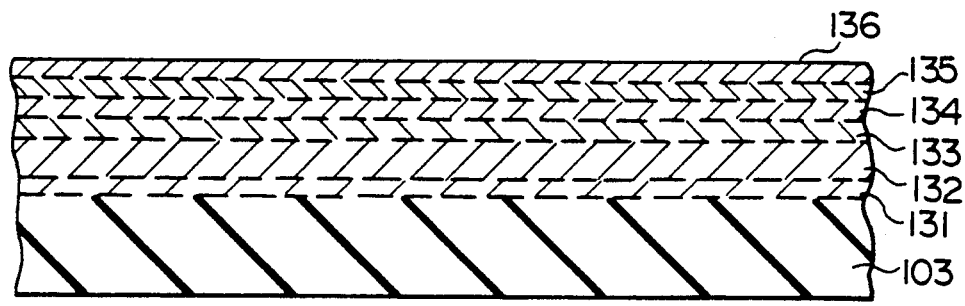
FIGS. 11A to 11F are cross sectional views showing a process sequence used for fabrication of the hybrid semiconductor device shown in FIG. 10.
Figure 11B:
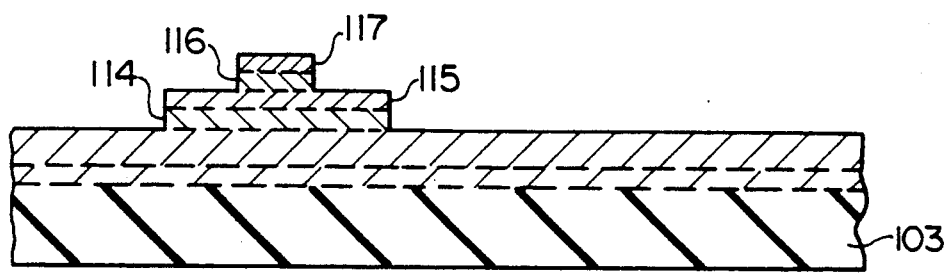

Turning to FIG. 11A to 11F, description is made for a process for fabricating the structure shown in FIG. 10. The process sequence starts with preparation of the semi-insulating substrate 103 of gallium arsenide. On the semi-insulating substrate 103 are successively grown an n-type gallium arsenide film 131, a heavily doped n-type gallium arsenide film 132, an n-type gallium arsenide film 133, a heavily doped p-type gallium arsenide film 134, an n-type aluminum gallium arsenide film 135 and a heavily doped n-type gallium arsenide film 136 by using a molecular beam epitaxy. The film 131 serves as the first film 105. The heavily doped n-type gallium arsenide film 132 is doped with n-type impurity atoms of about $5 \times 10^{18}$ cm$^{-3}$ and has a thickness of about 4000 angstroms, and the n-type gallium arsenide film 133 is about 3000 angstroms in thick and has an n-type impurity concentration of about $5 \times 10^{16}$ cm$^{-3}$. The heavily doped p-type gallium arsenide film 134 is doped with p-type impurity atoms of about $4 \times 10^{19}$ cm$^{-3}$ and has a thickness of about 600 angstroms, and the n-type aluminum gallium arsenide film 135 forms a heterojunction together with the heavily-doped p-type gallium arsenide film 134. The aluminum gallium arsenide film 135 has an n-type impurity atom concentration of about $3 \times 10^{17}$ cm$^3$ and a thickness of about 1500 angstroms, and the heavily doped n-type gallium arsenide film 136 is doped with n-type impurity atoms of about $5 \times 10^{18}$ cm$^{-3}$ and about 1000 angstroms in thick. The resultant structure of this stage is illustrated in FIG. 11A.

An appropriate mask layer is formed on the structure, and the heavily doped gallium arsenide film 136 and the n-type aluminum gallium arsenide film 135 are etched away to form the emitter cap layer 117 and the emitter layer 116. The mask formation and the etching process are repeated to form the base and collector layers 115 and 114, and, consequently, the structure is partially shaped into an emitter-mesa configuration and partially shaped into a base-mesa configuration as will be seen from FIG. 11B.

Figure 11C:
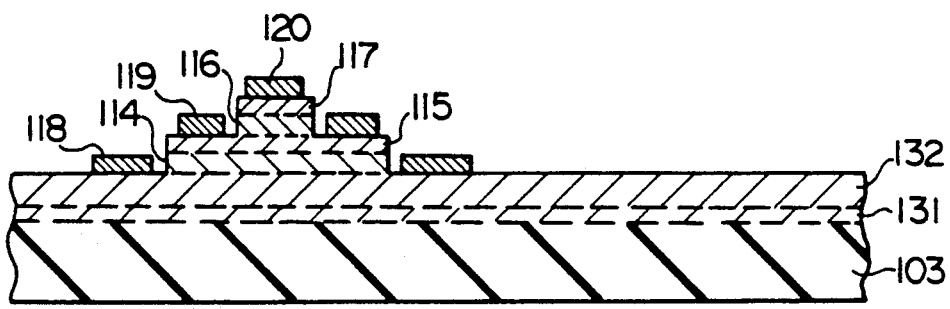

Subsequently, the emitter electrode 120, the base electrode 119 and the collector electrode 118 are formed on the emitter cap layer 117, the base layer 115 and the heavily doped n-type gallium arsenide film 132, respectively, by sequentially applying a deposition technique and photoresist and lift-off techniques, however, detailed description is omitted, because these techniques are well known in the art. The resultant structure of this stage is shown in FIG. 11C.

Figure 11D:
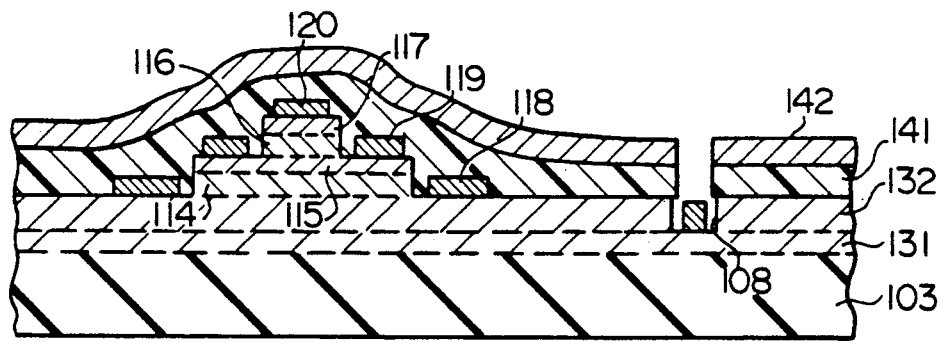

A photoresist solution is spread over the entire surface, and the photoresist film is patterned to form a photoresist mask 141. Using the photoresist mask 141, the heavily doped n-type gallium arsenide film 132 is partially removed to form the recess 108, and the recess 108 exposes the top surface of the n-type gallium arsenide film 131 or the first layer 105. Aluminum 142 or, alternatively, an aluminum alloy is deposited over the entire surface of the structure, and the aluminum reaches the exposed top surface of the n-type gallium arsenide film 131 as shown in FIG. 11D. When the photoresist mask 141 is stripped off, the aluminum is left on the top surface of the n-type gallium arsenide film 131, and the aluminum thus left on the top surface serves as the gate electrode 109.

Figure 11E:
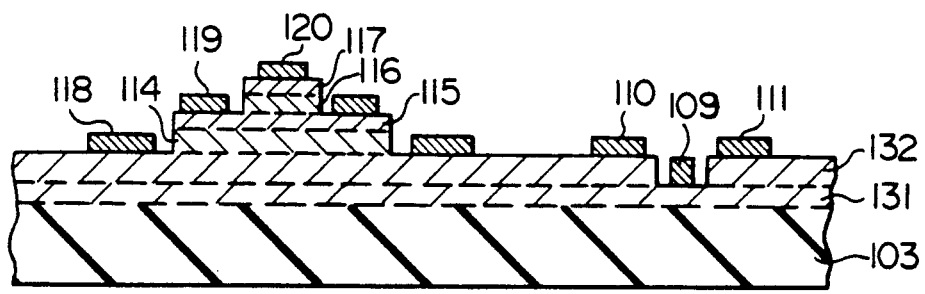

A deposition technique and the photoresist lift-off techniques are applied to the resultant structure again, and, consequently, the source and drain electrodes 110 and 111 are formed on those areas over the respective side areas with respect to the gate electrode 109. The resultant structure of this stage is shown in FIG. 11E.

Figure 11F:
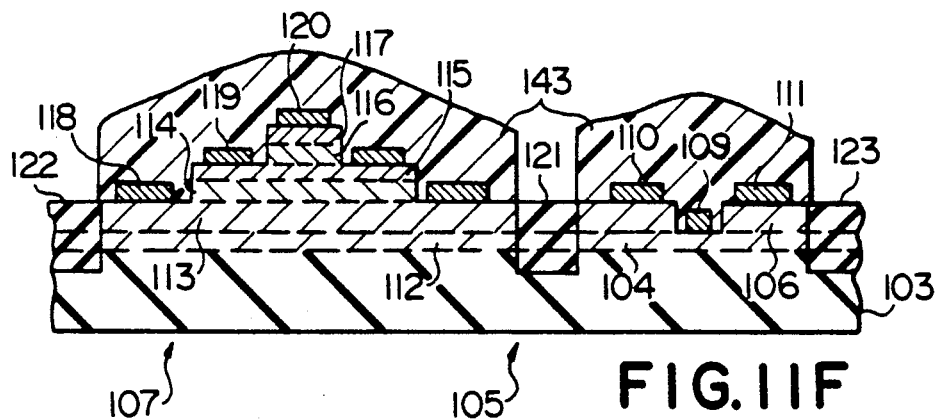

A photoresist solution is spun onto the entire surface of the structure again, and the photoresist film is patterned to form a photoresist mask 143 which partially expose the heavily doped gallium arsenide film 132. Boron atoms are ion implanted into the exposed heavily doped n-type gallium arsenide film 132 at dose of about $3 \times 10^{15}$ cm$^{-2}$ with the acceleration energy of about 400 KeV. With the implanted boron atoms, the isolation regions 121 to 123 are formed in the structure as shown in FIG. 11F, and the isolation region 121 electrically separates the heterojunction bipolar transistor 102 from Schottky gate type field effect transistor 101.

After the formation of the isolation regions 121 to 123, the photoresist mask 143 is stripped off, and the hybrid semiconductor device shown in FIG. 10 is obtained.

Fourth Embodiment

Figure 12:
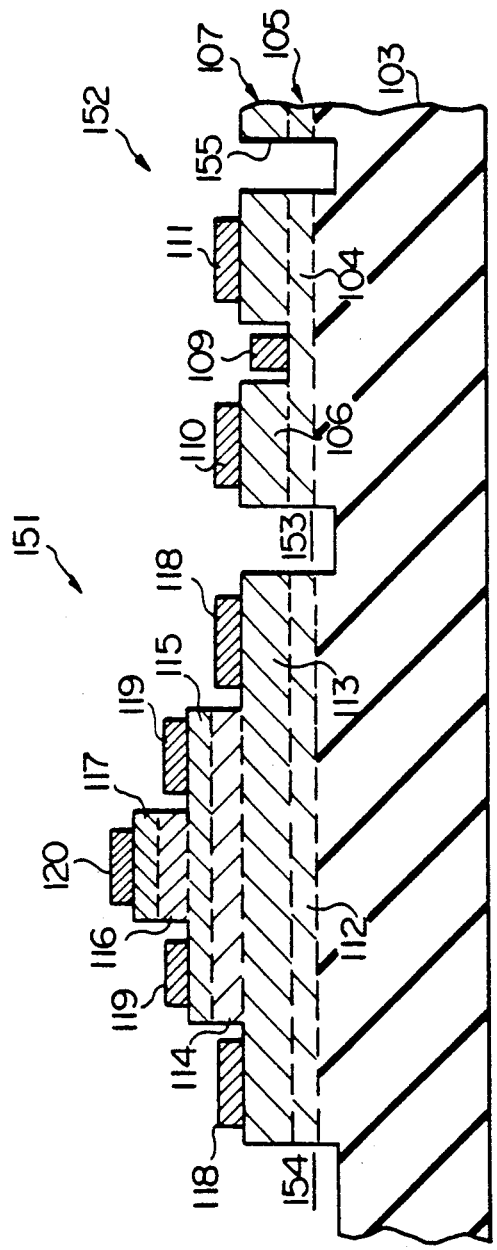
FIG. 12 is a cross sectional view showing the structure of still another hybrid semiconductor device embodying the present invention.

Turning to FIG. 12 of the drawings, another hybrid semiconductor device is implemented by a heterojunction bipolar transistor 151 and an Schottky gate type field effect transistor 152 in accordance with the present invention. However, the heterojunction bipolar the Schottky gate type field effect transistor 152 are similar in structure to the heterojunction bipolar transistor 102 and the Schottky gate type field effect transistor 101, and, for this reason, the component layers are designated by like reference numerals used in FIG. 10 for the sake of simplicity.

The hybrid semiconductor device shown in FIG. 12 is characterized by hollow spaces 153 to 155 serving as isolation means. The hollow spaces 153 to 155 penetrate from the common layer 107 and reach the semi-insulating substrate 103. The hollow spaces 153 to 155 thus shaped provide electric isolation among the component elements.

Figure 13A:
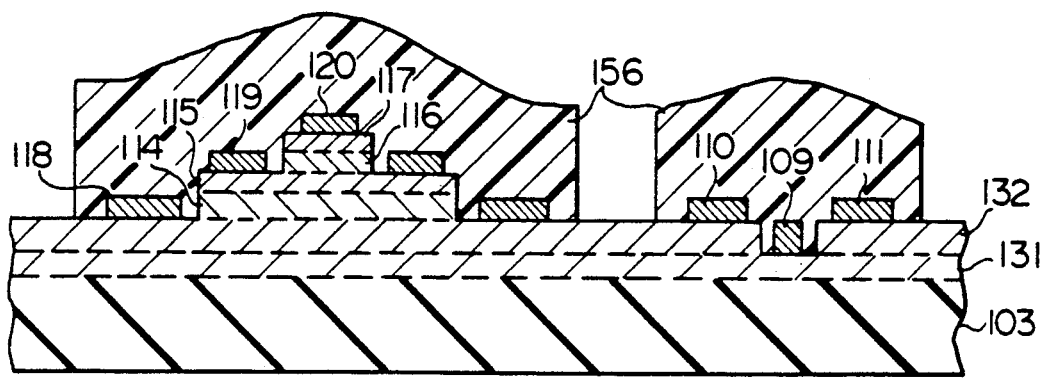
FIGS. 13A and 13B are cross sectional views showing an essential part of a process sequence through which the structure shown in FIG. 12 is fabricated.
Figure 13B:
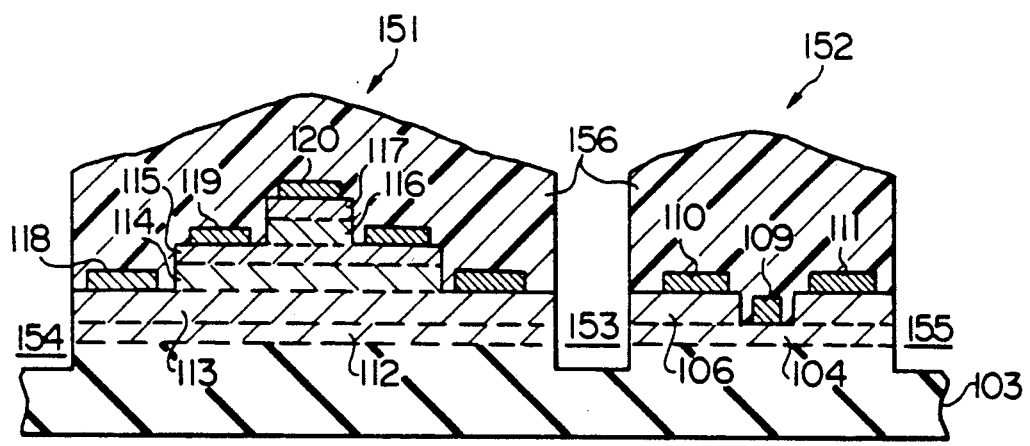

A process sequence for the hybrid semiconductor device is partially identical with the process sequence for the fabrication of the hybrid semiconductor device shown in FIG. 10. Namely, the process sequence passes through the stages illustrated in FIGS. 11A to 11E, and, then, a photoresist solution is spun onto the entire surface of the structure. The photoresist film is patterned to form a photoresist mask 156 through an exposure stage followed by a development stage, and the photoresist mask 156 exposes peripheral areas of the heterojunction bipolar transistor 151 and the Schottky gate type field effect transistor 152 as shown in FIG. 13A Upon completion of the photoresist mask 156, the common layer 132 and the first layer 131 are partially removed by using an anisotropical etching technique such as, for example, a reactive ion etching technique. This results in the hollow spaced 153 to 155, and the hollow space 153 electrically separates the heterojunction bipolar transistor 151 from Schottky gate type field effect transistor 152.

As will be understood from the foregoing description, the hybrid semiconductor device according to the present invention is fabricated by the uniform epitaxial growth followed by the etching stages, and the uniform epitaxial growth is advantageous over the selective epitaxial growth in controllability and in the film quality, so that the heterojunction bipolar transistor as well as the unipolar compound semiconductor transistor are improved on the device characteristics. Moreover, the process according to the present invention is conducive to reduction in the production cost by virtue of the uniform epitaxial growth.

Although particular embodiments of the present invention have been shown and described, it will be obvious to those skilled in the art that various changes and modifications may be made without departing from the spirit and scope of the present invention. For example, the hybrid semiconductor devices are fabricated by using the combinations of gallium arsenides and aluminum gallium arsenide, however, these materials are replaceable with compound semiconductor materials such as, for example, the indium phosphide system. The emitter cap layer may be formed of a heavily doped indium gallium arsenide or a heavily doped n-type germanium. Moreover, a graded structure may be formed in the emitter cap layer, the emitter-base junction and the base layer for further accelerating the carriers.

What is claimed is:

1. A hybrid semiconductor device fabricated on a semi-insulating substrate of a first compound semiconductor material, comprising:
    a first multiple-level structure formed of a first group of compound semiconductor materials and providing a Schottky gate type field effect unipolar transistor together with a gate electrode and source and drain electrodes, a first section of said first multiple-level structure having the upper-most level provided by a first portion of a common layer, said first multiple-level structure including a first multiple-level structure including a first layer of n-type gallium arsenide formed on said semi-insulating substrate and the first portion of said common layer of heavily doped n-type gallium arsenide formed on the first layer;
    a second multiple-level structure formed of a second group of compound semiconductor materials and providing a bipolar transistor together with emitter, base and collector electrodes, said second multiple-level structure having the lowest level provided by a second portion of said common layer; and
    isolating means penetrating said common layer and said first multiple-level structure for providing an electrical isolation between said unipolar transistor and said bipolar transistor, in which said first portion is substantially coextensive with said second portion, and in which a second section of said first multiple-level structure is overlain by said second multiple-level structure.

2. A hybrid semiconductor device as set forth in claim 1, in which said isolation means are formed by a third portion of said common layer between said first and second portions of said common layer and a third section of said first multiple-level structure between said first and second sections of said first multiple-level structure, and in which said third portion and said third section are doped with boron atoms so as to be converted into insulating materials.

3. A hybrid semiconductor device as set forth in claim 2, in which said first portion of the common layer exposes a part of said first layer where said gate electrode is formed, and in which said source and drain electrodes are formed on said first portion of said common layer on both sides of said gate electrode.

4. A hybrid semiconductor device as set forth in claim 3, in which said gate electrode is formed of aluminum, and in which said source and drain electrode are formed on a gold-germanium-nickel alloy.

5. A hybrid semiconductor device as set forth in claim 1, in which said isolating means are formed by insulating materials.

6. A hybrid semiconductor device fabricated on a semi-insulating substrate of a first compound semiconductor material, comprising:
    a first multiple-level structure formed of a first group of compound semiconductor materials and providing a high electron mobility unipolar transistor together with a gate electrode and source and drain electrodes, a first section of said first multiple-level structure having the uppermost level provided by a first portion of a common layer, said first multiple-level structure including a first layer of n-type gallium arsenide formed on said semi-insulating substrate, and said first portion of said common layer of heavily-doped n-type gallium arsenide formed on said first layer;
    a second multiple-level structure formed of a second group of compound semiconductor materials and providing a heterojunction bipolar transistor together with emitter, base and collector electrodes, said second multiple-level structure having the lowest level provided by a second portion of said common layer; and
    isolating means penetrating said common layer and said first multiple-level structure for providing an electrical isolation between said unipolar transistor and said bipolar transistor, in which said first portion is substantially coextensive with said second portion, and in which a second section of said first multiple-level structure is overlain by said second multiple-level structure.

7. A hybrid semiconductor as set forth in claim 6, in which said second portion of the common layer is formed of heavily-doped n-type gallium arsenide and serves as a sub-collector layer, and in which said second multiple-level structure includes a collector layer of n-type gallium arsenide formed on said sub-collector layer, a base layer of heavily-doped p-type gallium arsenide formed on the collector layer, an emitter layer of n-type aluminum gallium arsenide formed on the base layer, and an emitter cap layer of heavily-doped n-type gallium arsenide formed on the emitter layer.

8. A hybrid semiconductor device fabricated on a semi-insulating substrate of a first compound semiconductor material, comprising:
   a first multiple-level structure formed of a first group of compound semiconductor materials and providing a Schottky gate type field effect unipolar transistor together with a gate electrode and source and drain electrodes, a first section of said first multiple-level structure having the uppermost level provided by a first portion of a common layer, said first multiple-level structure including a first layer of n-type gallium arsenide formed on said semi-insulating substrate and the first portion of said common layer of heavily-doped n-type gallium arsenide formed on the first layer;
   a second multiple-level structure formed of a second group of compound semiconductor materials and providing a heterojunction bipolar transistor together with emitter, base and collector electrodes, said second multiple-level structure having the lowest level provided by a second portion of said common layer; and
   isolating hollow spaces penetrating said common layer and said first multiple-level structure for providing an electrical isolation between said unipolar transistor and said bipolar transistor, in which said first portion is substantially coextensive with said second portion, and in which a second section of said first multiple-level structure is overlain by said second multiple-level structure.

9. A hybrid semiconductor device as set forth in claim 8, in which said second portion of the common layer is formed of heavily-doped n-type gallium arsenide and serves as a sub-collector layer, and in which said second multiple-level structure includes a collector layer of n-type gallium arsenide formed on said sub-collector layer, a base layer of heavily-doped p-type gallium arsenide formed on the collector layer, an emitter layer of n-type aluminum gallium arsenide formed on the base layer, and an emitter cap layer of heavily-doped n-type gallium arsenide formed on the emitter layer.

10. A hybrid semiconductor device fabricated on a semi-insulating substrate of a first compound semiconductor material, comprising:
    a first multiple-level structure formed of a first group of compound semiconductor materials and providing a Schottky gate type field effect unipolar transistor together with a gate electrode and source and drain electrodes, a first section of said first multiple-level structure having the upper-most level provided by a first portion of a common layer;
    a second multiple-level structure formed of a second group of compound semiconductor materials and providing a bipolar transistor of a heterojunction bipolar transistor together with emitter, base and collector electrodes, said second multiple-level structure having the lowest level provided by a second portion of said common layer, said second portion of the common layer being formed of heavily-doped n-type gallium arsenide serving as a sub-collector layer, said second multiple-level structure including a collector layer of n-type gallium arsenide formed on said sub-collector layer, a base layer of heavily-doped p-type gallium arsenide formed on the collector layer, an emitter layer of n-type aluminum gallium arsenide formed on the base layer, and an emitter cap layer of heavily-doped n-type gallium arsenide formed on the emitter layer; and
    isolating means penetrating said common layer and said first multiple-level structure for providing an electrical isolation between said unipolar transistor and said bipolar transistor, in which said first portion is substantially coextensive with said second portion, and in which a second section of said first multiple-level structure is overlain by said second multiple-level structure.

11. A hybrid semiconductor device as set forth in claim 10, in which said collector electrode, said base electrode and said emitter electrode are formed on said sub-collector layer, said base layer and said emitter cap layer, respectively, and in which said base electrode and said collector and emitter electrodes are respectively made of a gold-manganese-nickel alloy and a gold-germanium-nickel alloy.

12. A hybrid semiconductor device as set forth in claim 10, in which said first multiple-level structure includes a first layer of n-type gallium arsenide formed on said semi-insulating substrate and the first portion of said common layer of heavily doped n-type gallium arsenide formed on the first layer.

13. A hybrid semiconductor device as set forth in claim 12, in which said isolation means are formed by a third portion of said common layer between said first and second portions of said common layer and a third section of said first multiple-level structure between said first and second sections of said first multiple-level structure, and in which said third portion and said third section are doped with boron atoms so as to be converted into insulating materials.

14. A hybrid semiconductor device as set forth in claim 13, in which said first portion of the common layer exposes a part of said first layer where said gate electrode is formed, and in which said source and drain electrodes are formed on said first portion of said common layer on both sides of said gate electrode.

15. A hybrid semiconductor device as set forth in claim 14, in which said gate electrode is formed of aluminum, and in which said source and drain electrodes are formed of a gold-germanium-nickel alloy.

16. A hybrid semiconductor device as set forth in claim 10, in which said isolating means are formed by insulating materials.

17. A hybrid semiconductor device fabricated on a semi-insulating substrate of a first compound semiconductor material, comprising:
    a first multiple-level structure formed of a first group of compound semiconductor materials and providing a high electron mobility unipolar transistor together with a gate electrode and source and drain electrodes, a first section of said first multiple-level structure having the uppermost level provided by a first portion of a common layer;
    a second multiple-level structure formed of a second group of compound semiconductor materials and providing a heterojunction bipolar transistor together with emitter, base and collector electrodes, said second multiple-level structure having the lowest level provided by a second portion of said common layer, said second portion of said common layer being formed of heavily-doped n-type gallium arsenide serving as a sub-collector layer, said second multiple-level structure including a collector layer of n-type gallium arsenide formed on said sub-collector layer, a base layer of heavily-doped p-type gallium arsenide formed on the collector layer, an emitter layer of n-type aluminum gallium arsenide formed on the base layer, and an emitter cap layer of heavily-doped n-type gallium arsenide formed on said emitter layer; and isolating means penetrating said common layer and said first multiple-level structure for providing an electrical isolation between said unipolar transistor and said bipolar transistor, in which said first portion is substantially coextensive with said second portion, and in which a second section of said first multiple-level structure is overlain by said second multiple-level structure.

18. A hybrid semiconductor device as set forth in claim 17, in which said collector electrode, said base electrode and said emitter electrode are formed on said sub-collector layer, said base layer and said emitter cap layer, respectively, and in which said base electrode and said collector and emitter electrodes are respectively made of a gold-manganese-nickel alloy and a gold-germanium-nickel alloy.

19. A hybrid semiconductor device as set forth in claim 17, in which said isolating means are formed by insulating materials.

20. A hybrid semiconductor device fabricated on a semi-insulating substrate of a first compound semiconductor material, comprising:

a first multiple-level structure formed of a first group of compound semiconductor materials and providing a high electron mobility unipolar transistor together with a gate electrode and source and drain electrodes, a first section of said first multiple-level structure having he uppermost level provided by a first portion of a common layer, said first multiple-level structure including a first layer of intentionally undoped gallium arsenide formed on said semi-insulating substrate, a second layer of n-type aluminum gallium arsenide formed on said first layer and overlain by said first portion of said common layer, said first portion of said common layer being formed of heavily-doped n-type gallium arsenide;

a second multi-level structure formed of a second group of compound semiconductor materials and providing a bipolar transistor together with emitter, base and collector electrodes, said second multiple-level structure having the lowest level provided by a second portion of said common layer; and isolating means penetrating said common layer and said first multiple-level structure for providing an electrical isolation between said unipolar transistor and said bipolar transistor, in which said first portion is substantially coextensive with said second portion, and in which a second section of said first multiple-level structure is overlain by said second multiple-level structure.

21. A hybrid semiconductor device as set forth in claim 20, in which said isolation means are of insulating materials and formed by a third portion of said common layer between said first and second portions of said common layer and a third section of said first multiple-level structure between said first and second sections of said first multiple-level structure, and in which said third portion and said third section are doped with boron atoms so as to be converted into said insulating materials.

22. A hybrid semiconductor devices as set forth in claim 21, in which said first portion of the common layer exposes a part of said second layer where said gate electrode is formed, and in which said source and drain electrodes are formed on said first portion on both sides of said gate electrode.

23. A hybrid semiconductor device as set forth in claim 22, in which said gate electrode is formed of aluminum, and in which said source and drain electrodes are formed of a gold-germanium-nickel alloy.

24. A hybrid semiconductor device as set forth in claim 20, in which said isolating means are formed by insulting materials.

* * * * *